(12) United States Patent
Eaglesham

(10) Patent No.: US 8,703,527 B2
(45) Date of Patent: Apr. 22, 2014

(54) PHOTOVOLTAIC DEVICES INCLUDING COPPER INDIUM GALLIUM SELENIDE

(75) Inventor: David Eaglesham, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 384 days.

(21) Appl. No.: 12/623,364

(22) Filed: Nov. 20, 2009

(65) Prior Publication Data

US 2010/0186812 A1   Jul. 29, 2010

Related U.S. Application Data

(60) Provisional application No. 61/117,847, filed on Nov. 25, 2008.

(51) Int. Cl.
  *H01L 21/00* (2006.01)

(52) U.S. Cl.
  USPC .......................................................... 438/95

(58) Field of Classification Search
  CPC ...................................................... H01L 31/206
  USPC .......................... 438/95, 84, 83; 136/264, 265
  See application file for complete search history.

(56) References Cited

U.S. PATENT DOCUMENTS

| | | | |
|---|---|---|---|
| 5,045,409 A | 9/1991 | Eberspacher et al. | |
| 5,248,349 A | 9/1993 | Foote et al. | |
| 5,372,646 A | 12/1994 | Foote et al. | |
| 5,470,397 A | 11/1995 | Foote et al. | |
| 5,536,333 A | 7/1996 | Foote et al. | |
| 5,945,163 A | 8/1999 | Powell et al. | |
| 6,037,241 A * | 3/2000 | Powell et al. | 438/479 |
| 6,399,873 B1 * | 6/2002 | Sano et al. | 136/249 |
| 6,444,043 B1 | 9/2002 | Gegenwart et al. | |
| 7,053,294 B2 | 5/2006 | Tuttle et al. | |
| 2005/0074915 A1 | 4/2005 | Tuttle et al. | |
| 2005/0202589 A1 * | 9/2005 | Basol | 438/102 |
| 2006/0096635 A1 * | 5/2006 | Tuttle | 136/262 |
| 2007/0163639 A1 * | 7/2007 | Robinson et al. | 136/262 |
| 2007/0163643 A1 * | 7/2007 | Van Duren et al. | 136/262 |
| 2007/0237894 A1 | 10/2007 | Powell | |
| 2008/0128013 A1 | 6/2008 | Lopatin et al. | |
| 2008/0128020 A1 | 6/2008 | Zafar et al. | |
| 2008/0210295 A1 | 9/2008 | Basol | |
| 2008/0227236 A1 | 9/2008 | Luch | |
| 2008/0283389 A1 | 11/2008 | Aoki | |

FOREIGN PATENT DOCUMENTS

CN    1950953 A    4/2007

OTHER PUBLICATIONS

Kestner et al., Solar Energy Materials & Solar Cells, 83 (2004) 55-65.*

* cited by examiner

*Primary Examiner* — Eli Mekhlin
(74) *Attorney, Agent, or Firm* — Dickstein Shapiro LLP

(57) ABSTRACT

A copper indium gallium selenide photovoltaic cell can include a substrate having a transparent conductive oxide layer. The copper indium gallium selenide can be deposited using sputtering and vapor transport deposition.

15 Claims, 2 Drawing Sheets

… (continued)

PHOTOVOLTAIC DEVICES INCLUDING COPPER INDIUM GALLIUM SELENIDE

CLAIM OF PRIORITY

This application claims priority to U.S. Provisional Patent Application No. 61/117,847, filed on Nov. 25, 2008, which is incorporated by reference in its entirety.

TECHNICAL FIELD

This invention relates to CIGS photovoltaic devices.

BACKGROUND

With the recent focus on alternative energy, solar cell technology is growing rapidly. Thin-film solar cell technology is a promising alternative to silicon solar cell technology. Copper indium gallium selenide (CIGS) is a well-known thin-film photovoltaic absorber material that is being intensively pursued for commercialization. It is well-known to deliver good efficiency at the dot-cell level and has been taken to pilot-scale production by several companies, but no current process delivers satisfactory productivity.

SUMMARY

In general, a method of manufacturing an optical device substrate can include depositing a layer including cadmium, indium and gallium on a surface of the substrate by sputtering, and depositing a selenium layer on the layer including cadmium, indium and gallium by vapor transport deposition. The optical device can be a thin film photovoltaic device. The layer including cadmium, indium and gallium deposition may occur before the selenium layer deposition. The cadmium, indium and gallium sputtering and selenium deposition may be repeated multiple times.

An optical device substrate can include a substrate, a sputtered layer including cadmium, indium and gallium in contact with a surface of the substrate, and a selenium layer deposited on the layer including cadmium, indium and gallium. In certain circumstances, a substrate can be a glass substrate. The optical device substrate can be used in a photovoltaic cell. The photovoltaic cell can further include a transparent conductive layer, which can be indium tin oxide.

The details of one or more embodiments are set forth in the accompanying drawings and the description below. Other features, objects, and advantages will be apparent from the description and drawings, and from the claims.

DETAILED DESCRIPTION

Figure 1:
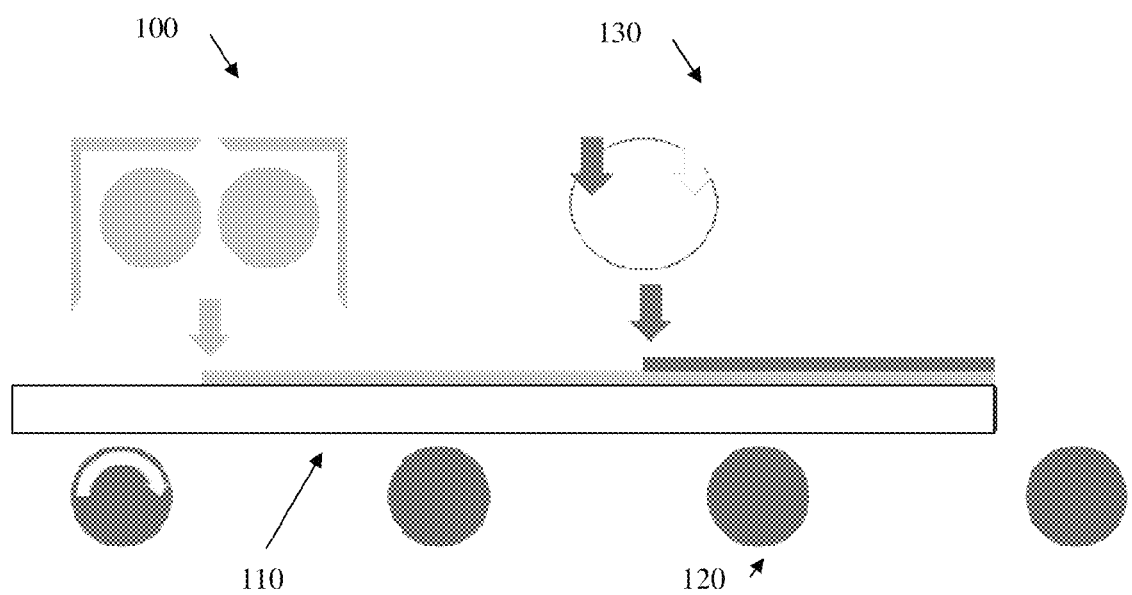
FIG. 1 is a schematic of a two stage deposition system.

There are two basic approaches to deposition of copper indium gallium selenide (CIGS): simultaneous co-deposition of all of the elements in stoichiometric form ($Cu(InGa)Se_2$) and post-selenisation of a metal-alloy film ($CuInGa+2Se$).

Co-deposition has major control problems and has proven prohibitively expensive in manufacturing largely because of the difficulty of scaling elemental evaporation. Although quite successful and relative easy to implement on a small research and development scale, scale-up to a commercially viable level proves to be rather challenging, as a number of conditions are encountered during continuous manufacturing that differ from the laboratory process. Such differences include both those imposed by continuous processing of moving substrates, and those implemented to decrease costs and increase throughput.

Metal precursor films for selenisation can be deposited using a range of techniques including sputtering and electroplating. The recent record-breaking 18.8%-efficient CIGS-based device fabricated in research laboratories is based on a multistep process using physical vapor deposition (PVD). The PVD method is a useful tool for understanding film growth and for developing models, but difficult to scale up. Sputtering techniques are suitable for large-area deposition; however, they require expensive vacuum equipment and sputtering targets. Electroplating (EP) and auto-plating (AP) are potentially suitable preparation methods to obtain low-cost precursor films. However, the post-selenisation step is very long (200 hour processes reported for some steps). Rapid-Thermal Selenisation is being explored but remains unproven for large scale processes.

Reactive sputtering offers an alternative to co-evaporation. In this process the metals are sputtered from a conventional metal target (cadmium, indium and gallium, sometimes with some selenium added), and simultaneously reacted with a selenium vapor. Metal target can be planar or rotatable. Typically reactive sputtering approaches for CIGS have used a conventional evaporator such as the Veeco commercial product. This approach has serious drawbacks that have prevented adoption. Amongst other issues the two most fatal are: the use of a narrow outlet that is cooler than the evaporator itself makes the source inherently prone to clogging, and the requirement of a large source area with uniform distribution across a wide substrate makes the design very difficult to scale (involving a complex arrangement of heated pipes to distribute the material). Reactive-sputtering of copper, indium or gallium, and combinations thereof, can be combined with Vapor Transport Deposition (VTD) as described in co-owned U.S. Pat. Nos. 5,945,163 and 6,037,241 for delivery of selenium. Vapor Transport Deposition as currently practiced is a thermal sublimation process involving an inert carrier gas. The VTD system is a proven production process that allows the use of powder-feeders to control the supply of the material, and generates a highly uniform flux of the material across a wide web. The VTD system has been used extensively in manufacturing and has been used to deposit a wide range of high-vapor-pressure materials.

In the adaptation of the VTD technology to the CIGS reactive-sputtering application the technology lends itself to a potential application. An approach is the use of a sequential-sputter-and-selenise approach in which rather than reacting a thick (1 micron) layer including cadmium, indium and gallium with selenium, there is a sequential selenisation following each metal target. Since there are typically ~10 metal sputtering sections in a commercial sputter-deposition system this allows for selenisation of 0.1 micron-thick cadmium, indium and gallium, which is much faster (time required increases as the square of the thickness so this is 100× faster). This approach also solves a second major issue with the sputter-and-selenise approach which is control of the gallium content (gallium tends to segregate during each selenisation but the final distribution can be controlled in the VTD-Reactive-sputter approach by breaking the film down into smaller components).

Referring to FIG. 1, a two stage system can include an initial reactive sputtering deposition stage 100 that deposits the layer including cadmium, indium and gallium onto a glass substrate 110. The substrate 110 travels through the initial stage 100 on a conveyer 120. Next, a subsequent vapor transport deposition stage 130 deposits a selenium layer on the cadmium, indium and gallium layer 110 using a thermal sublimation process involving an inert carrier gas. The substrate 110 continues through the subsequent stage 130 along the conveyer 120. As described above, the two stage sputter-and-selenise system of FIG. 1 is repeated multiple times, e.g., 5 times, 10 times, 15 times, etc. In this way, the component distribution can be controlled and the total selenisation time is reduced.

Figure 2:
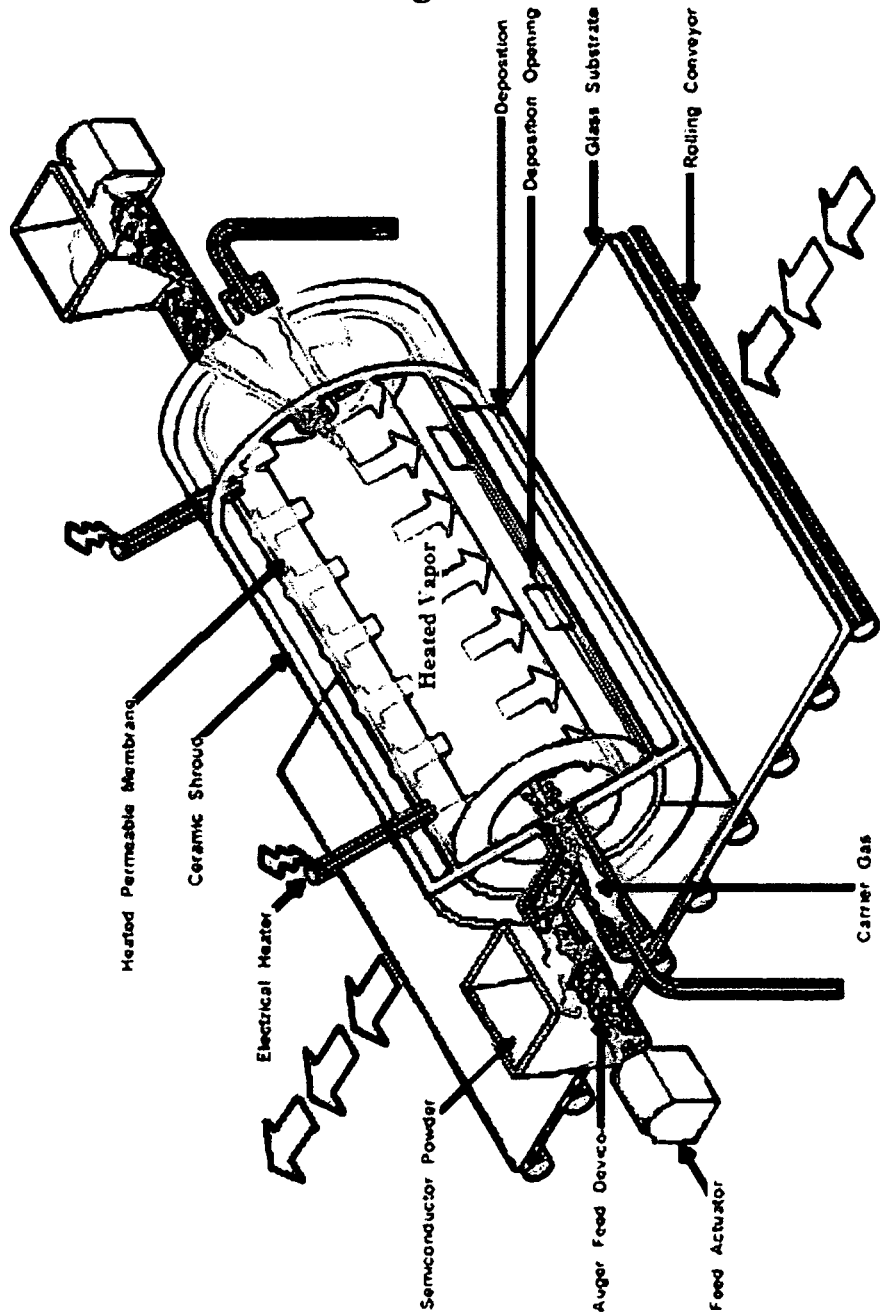
FIG. 2 is a detailed schematic the second stage of the two stage deposition system.

Referring to FIG. 2, a detailed illustration of the vapor transport deposition selenium stage 130 is shown. In FIG. 2, the substrate 110 carried on the conveyer 120 passes through the vapor transport deposition stage 130.

For the vapor transport deposition, a carrier gas is combined with semiconductor powder through an auger feed device controlled by a feed actuator. The auger feed device can becan a rotary screw that provides a good distribution of the carrier gas and the semiconductor powder. The amount of semiconductor material introduced as a powder can be accurately controlled by the rate of screw rotation. The carrier gas and semiconductor powder are heated by an electrical heater into a heated vapor, which passes through a heated permeable membrane for deposition onto the glass substrate. The ceramic shroud traps the heated vapor, forcing the vapor through the deposition openings onto the glass substrate. The ceramic shroud can be spaced from the conveyed glass substrate a distance for efficient deposition, e.g., in the range of 0.5 to 3.0 centimeters. The ceramic shroud can also reduce radiant heat transfer from the hot permeable membrane to the glass substrate. More specifically, the amount of energy the ceramic shroud radiates to the glass substrate can be reduced because its outside surface temperature is lower than that of the hot permeable membrane.

A common photovoltaic cell can have multiple layers. The multiple layers can include a bottom layer that is a transparent conductive layer, a capping layer, a window layer, an absorber layer and a top layer. Each layer can be deposited at a different deposition station of a manufacturing line with a separate deposition gas supply and a vacuum-sealed deposition chamber at each station as required. The substrate can be transferred from deposition station to deposition station via a rolling conveyor until all of the desired layers are deposited. A top substrate layer can be placed on top of the top layer to form a sandwich and complete the photovoltaic cell.

Deposition of semiconductor layers in the manufacture of photovoltaic devices is described, for example, in U.S. Pat. Nos. 5,248,349, 5,372,646, 5,470,397, 5,536,333, 5,945,163, 6,037,241, and 6,444,043, each of which is incorporated by reference in its entirety. The deposition can involve transport of vapor from a source to a substrate, or sublimation of a solid in a closed system. An apparatus for manufacturing photovoltaic cells can include a conveyor, for example a roll conveyor with rollers. Other types of conveyors are possible. The conveyor transports substrate into a series of one or more deposition stations for depositing layers of material on the exposed surface of the substrate. Conveyors are described in non-provisional U.S. application Ser. No. 11/692,667, which is hereby incorporated by reference.

The deposition chamber can be heated to reach a processing temperature of not less than about 450° C. and not more than about 700° C., for example the temperature can range from 450-550° C., 550-650° C., 570-600° C., 600-640° C. or any other range greater than 450° C. and less than about 700° C. The deposition chamber includes a deposition distributor connected to a deposition vapor supply. The distributor can be connected to multiple vapor supplies for deposition of various layers or the substrate can be moved through multiple and various deposition stations with its own vapor distributor and supply. The distributor can be in the form of a spray nozzle with varying nozzle geometries to facilitate uniform distribution of the vapor supply.

The window layer and the absorbing layer can include, for example, CIGS. A top layer can cover the semiconductor layers. The top layer can include a metal such as, for example, aluminum, molybdenum, chromium, cobalt, nickel, titanium, tungsten, or alloys thereof. The top layer can also include metal oxides or metal nitrides or alloys thereof.

The bottom layer of a photovoltaic cell can be a transparent conductive layer. A thin capping layer can be on top of and at least covering the transparent conductive layer in part. The next layer deposited is the first semiconductor layer, which can serve as a window layer and can be thinner based on the use of a transparent conductive layer and the capping layer. The next layer deposited is the second semiconductor layer, which serves as the absorber layer. Other layers, such as layers including dopants, can be deposited or otherwise placed on the substrate throughout the manufacturing process as needed.

The transparent conductive layer can be a transparent conductive oxide, such as a metallic oxide like tin oxide, which can be doped with, for example, fluorine. This layer can be deposited between the front contact and the first semiconductor layer, and can have a resistivity sufficiently high to reduce the effects of pinholes in the first semiconductor layer. Pinholes in the first semiconductor layer can result in shunt formation between the second semiconductor layer and the first contact resulting in a drain on the local field surrounding the pinhole. A small increase in the resistance of this pathway can dramatically reduce the area affected by the shunt.

A capping layer can be provided to supply this increase in resistance. The capping layer can be a very thin layer of a material with high chemical stability. The capping layer can have higher transparency than a comparable thickness of semiconductor material having the same thickness. Examples of materials that are suitable for use as a capping layer include silicon dioxide, dialuminum trioxide, titanium dioxide, diboron trioxide and other similar entities. Capping layer can also serve to isolate the transparent conductive layer electrically and chemically from the first semiconductor layer preventing reactions that occur at high temperature that can negatively impact performance and stability. The capping layer can also provide a conductive surface that can be more suitable for accepting deposition of the first semiconductor layer. For example, the capping layer can provide a surface with decreased surface roughness.

The first semiconductor layer can serve as a window layer for the second semiconductor layer. The first semiconductor layer can be thinner than the second semiconductor layer. By being thinner, the first semiconductor layer can allow greater penetration of the shorter wavelengths of the incident light to the second semiconductor layer.

The second semiconductor layer can be deposited onto a first semiconductor layer. A capping layer can serve to isolate a transparent conductive layer electrically and chemically from the first semiconductor layer preventing reactions that occur at high temperature that can negatively impact performance and stability. The transparent conductive layer can be deposited over a substrate.

A system for generating electrical energy can include a transparent conductive layer on a substrate, a first semiconductor layer including a wide bandgap semiconductor, a second semiconductor layer, an interfacial layer in contact with a second semiconductor layer. The interfacial layer can maintain the chemical potential of the second semiconductor layer at a controlled level in the interfacial region of the second semiconductor layer, a first electrical connection connected to the transparent conductive layer, and a second electrical connection connected to the back metal contact. The interfacial layer can be between the second semiconductor layer and a back metal contact.

A system for generating electrical energy can include a first electrode connected to the transparent conductive layer and a second electrode connected to the back metal contact. The first electrode can be substantially transparent to light having an energy between 1 and 3 eV, and the second electrode can be largely transparent to light with energy below the bandgap of the second semiconductor. A system for generating electrical energy can include two or more photovoltaic devices positioned in tandem.

A number of embodiments have been described. Nevertheless, it will be understood that various modifications may be made without departing from the spirit and scope of the claimed device. For example, the semiconductor layers can include a variety of other materials, as can the materials used for the buffer layer and the capping layer. Accordingly, other embodiments are within the scope of the following claims.

What is claimed is:

1. A method of manufacturing a photovoltaic device comprising:
   sequentially forming a plurality of material layers over a substrate by:
   depositing by sputtering a first layer including copper, indium and gallium over the substrate;
   depositing by vapor transport deposition a selenium layer over and in direct contact with the first layer including copper, indium and gallium to form a selenium layer directly over the first layer including copper, indium, and gallium;
   depositing by sputtering a second layer including copper, indium and gallium over and in direct contact with the selenium layer directly over the first layer including copper, indium and gallium; and
   depositing by vapor transport deposition a selenium layer over and in direct contact with the second layer including copper, indium and gallium to form a second selenium layer directly over the second layer including copper, indium and gallium.

2. The method of claim 1, wherein the substrate comprises glass.

3. The method of claim 1, further comprising:
   depositing a transparent conductive layer over the substrate prior to the sequentially forming of a plurality of material layers.

4. The method of claim 3, wherein the transparent conductive layer is a transparent conductive oxide layer.

5. The method of claim 4, wherein the transparent conductive oxide layer is indium tin oxide.

6. The method of claim 1, wherein the sequentially forming of a plurality of material layers includes forming at least 4 pairs of a selenium layer directly over a layer including copper, indium, and gallium, wherein each pair of layers is formed over and in direct contact with a respective pair of a selenium layer formed directly over a layer including copper, indium, and gallium.

7. The method of claim 1, wherein the sequentially forming of a plurality of material layers includes forming at least 9 pairs of a selenium layer directly over a layer including copper, indium, and gallium, wherein each pair of layers is formed over and in direct contact with a respective pair of a selenium layer formed directly over a layer including copper, indium, and gallium.

8. The method of claim 1, further comprising:
   depositing a plurality of additional layers including copper, indium, and gallium over the substrate; and
   depositing selenium over and in direct contact with each of the plurality of additional layers.

9. A method of manufacturing a photovoltaic device comprising:
   depositing by sputtering a first layer including copper, indium and gallium over a substrate;
   combining a carrier gas and selenium;
   heating the carrier gas and selenium combination to form a heating vapor;
   passing the heated vapor through a permeable membrane;
   depositing a selenium layer from the vapor over and in direct contact with the first layer including copper, indium and gallium;
   depositing by sputtering a second layer including copper, indium and gallium over and in direct contact with the selenium layer directly over the first layer including copper, indium and gallium; and
   depositing a selenium layer over and in direct contact with the second layer including copper, indium and gallium.

10. The method of claim 9, further comprising depositing a transparent conductive layer over the substrate prior to the depositing the first layer including copper, indium and gallium.

11. The method of claim 10, wherein the transparent conductive layer is a transparent conductive oxide layer.

12. The method of claim 11, wherein the transparent conductive oxide layer is indium tin oxide.

13. A method of manufacturing a photovoltaic device comprising:
   depositing by sputtering a first layer including copper, indium and gallium over a substrate; and
   depositing by vapor transport deposition a selenium layer over and in direct contact with the first layer including copper, indium and gallium to form a first selenium layer directly over the first layer including copper, indium and gallium,
   wherein the first layer including copper, indium and gallium is no more than about 0.1 micron thick;
   depositing by sputtering a second layer including copper, indium and gallium over and in direct contact with the first selenium layer directly over the first layer including copper, indium and gallium, the second layer being no more than about 0.1 micron thick; and
   depositing by vapor transport deposition a second selenium layer over and in direct contact with the second layer including copper, indium and gallium.

14. The method of claim 13, wherein deposition of selenium comprising:
   combining a carrier gas and selenium;
   heating the carrier gas and selenium combination to form a heated vapor;
   passing the heated vapor through a permeable membrane, and
   depositing the selenium from the vapor over and in direct contact with the first and second layers including copper, indium and gallium.

15. The method of claim 13, further comprising:
   depositing a plurality of additional layers including copper, indium, and gallium over the substrate; and depositing selenium over and in direct contact with each of the plurality of additional layers.

* * * * *